(12) United States Patent
Jo

(10) Patent No.: US 6,738,282 B2
(45) Date of Patent: May 18, 2004

(54) RANDOM ACCESS MEMORY AND METHOD FOR CONTROLLING OPERATIONS OF READING, WRITING, AND REFRESHING DATA OF THE SAME

(75) Inventor: Seong-Kue Jo, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 10/273,947

(22) Filed: Oct. 18, 2002

(65) Prior Publication Data

US 2003/0133321 A1 Jul. 17, 2003

(30) Foreign Application Priority Data

Jan. 12, 2002 (KR) .......................................... 2002-1874

(51) Int. Cl.$^7$ ............................................... G11C 11/24
(52) U.S. Cl. ................... 365/149; 365/205; 365/189.09
(58) Field of Search ............................. 365/149, 205, 365/189.09, 222, 189.01, 63, 51

(56) References Cited

U.S. PATENT DOCUMENTS 6,344,990 B1 * 2/2002 Matsumiya et al. .......... 365/63

* cited by examiner

*Primary Examiner*—David Lam
(74) *Attorney, Agent, or Firm*—F. Chau & Associates LLC

(57) ABSTRACT

The disclosure is a method of controlling operations in a static random access memory employing twin cells. After a wordline coupled to first and second cell transistors is conductive, a voltage difference between a first bitline, which is connected to a first cell capacitor through the first cell transistor, and a second bitline, which is connected to a second cell capacitor through the second cell transistor, is driven into a sense amplifier to be developed with amplification. An active wordline turns nonconductive when one of the bitline voltages accords with a predetermined reference voltage.

23 Claims, 11 Drawing Sheets

RANDOM ACCESS MEMORY AND METHOD FOR CONTROLLING OPERATIONS OF READING, WRITING, AND REFRESHING DATA OF THE SAME

This application claims priority to Korean Patent Application No. 2002-1874, filed on Jan. 12, 2002.

BACKGROUND OF THE INVENTION

1. Field of the Invention

The present invention generally relates to semiconductor memory, and more specifically, to static random access memories (SRAMs) employing twin memory cells as a storage unit.

2. Discussion of Related Art

Single-transistor dynamic random access memories are well known in the field of semiconductor memory devices. As shown in FIG. 1, a unit memory cell MC1 or MC2 comprises of one transistor TR and one capacitor C. A gate of the cell transistor TR is coupled to a wordline WL1, and a current channel of the cell transistor is formed between a bitline BL and a plate voltage terminal Vp that is connected to an electrode of the cell capacitor C. Another memory cell MC2, whose gate is coupled to another wordline WL2, forms its current channel between another bitline BLB (complementary to BL) and an electrode of the cell capacitor C. The bit line pair of BL and BLB are coupled to a sense amplifier 12.

In the structure of the DRAM cell array, if the wordline WL1 is selected, a cell data stored in the memory cell MC1 is transferred to the bitline BL through a charge sharing effect. The bitlines BL and BLB that have been held on a precharge voltage, e.g., at one half of a power supply voltage, increase/decrease or decrease/increase according to the data stored in the memory cell MC1 through the charge sharing. The voltage level of the bitline BL rises up to a high level if the data is "1" and falls down to a low level if the data is "0". Then, the sense amplifier 12 detects and amplifies the voltage difference between the bitlines BL and BLB.

Leakage currents arising from the structural properties of the DRAM reduce the charge amount of the cell capacitor, resulting in a data loss. A refresh is needed periodically to prevent the data loss. A DRAM refresh time is determined with regarding the maximal term of maintaining data "1" in a memory cell. One method for achieving a low-power operation is associated with the extension of the refresh time (or refresh period). Lengthening a refresh time is possible by adopting a twin-cell structure in a memory cell array, as shown in FIGS. 2 and 3. FIGS. 2 and 3 show twin-cell arrays also applicable in SRAMs.

In FIG. 2, one twin-cell, as a SRAM cell unit, comprises two DRAM-type cells MC1 and MC2. Each cell comprises one transistor TR and one capacitor C. While the cells MC1 and MC2 are respectively connected to the bitlines BL and BLB, which are coupled to a sense amplifier 22, the cell gates are coupled to one wordline WL1 in common. The cells MC1 and MC2 store a pair of complementary data bits "1" and "0".

Another kind of the twin-cell, as shown in FIG. 3, is a modification of the twin-cell structure of FIG. 2 in an arrangement pattern. Bitlines BL1~BL4 are alternately arranged in a column and a twin-cell is composed of two DRAM-type cells MC1 and MC2 (or MC3 and MC4) connected respectively to BL1 and BL3 (or BL2 and BL4). The bitlines BL1 and BL3, as a pair, are coupled to a sense amplifier 32, while BL2 and BL4 as another bitline pair are coupled to sense amplifier 34. A wordline WL1 is commonly coupled to gates of the cells MC1 and MC3 while a wordline WL2 to gates of MC2 and MC4. The cells in one twin-cell store a pair of complementary data bits logically.

In with a refresh of the twin-cell structure of FIG. 2, referring to FIG. 4A, the bitlines BL and BLB are set up to a precharge voltage VBL (0.5 AIVC) in response to a precharge signal PEQ before the wordline WL1 becomes active. At this time, assuming that the cell is preparing to store data "1" in MC1 and "0" in MC2, a cell node CN1 between the cell transistor and capacitor in MC1 maintains the power supply voltage level AIVC corresponding to data "1" while a cell node CN2 between the cell transistor and capacitor in MC2 hold a ground voltage level GND corresponding to data "0". Once the wordline WL1 is active, a charge sharing starts between MC1 and BL and between MC2 and BLB. As a result, a BL voltage increases by Vcsu, the voltage difference between the bitline voltage VBL (0.5 AIVC) to a shared-in voltage supplied from the cell MC1 (CN1), while BLB voltage decreases by Vcsd the voltage difference between VBL and a shared-out voltage discharged out of the cell MC2 (CN2). With a slight estrangement between BL and BLB, the sense amplifier 22 begins developing a voltage difference and thereby the bitline BL rises up to AIVC while the counter bitline BLB falls down to a ground voltage GND. At this time, the current voltage levels on BL and BLB are restored into the cell nodes CN1 and CN2, respectively. After then, if the wordline becomes inactive, the bitlines BL and BLB are set on the precharge voltage in response to the precharge signal PEQ.

As another operational feature for the twin-cell SRAM employing a column selection line CSL, referring to FIG. 4B, the column selection line CSL becomes conductive when a voltage difference is sufficiently settled between the bitlines BL and BLB after a charge sharing therebetween. The active CSL electrically connects the bitlines BL and BLB to corresponding input/output lines. During the CSL activation, the input/output lines have a precharge voltage level of an internal power supply voltage (i.e., AIVC), and the bitline BLB and the cell node CN2 are held at a clamping level. The bitline BL and the cell node CN1 are not affected. After CSL becomes inactive, BLB and CN2 fall to GND. Restored in the cell nodes, the bitline WL1 is shut down and the bitlines BL and BLB return to the precharge voltage level VBL in response to the precharge signal PEQ.

As aforementioned, since the DRAM-type cells in the twin-cell unit store a pair of complementary data bits, a bitline voltage difference is twice as large as that of the single cell structure. As shown in FIGS. 4A and 4B, the sense amplifier (22, 32 or 34) can take the voltage differential value of 2Vcs because BL and BLB increase and decrease simultaneously, by the Vcs through the charge sharing operations.

Therefore, the twin-cell memory does not need to define a refresh cycle time or period, capable of a normal sensing operation even though a leakage current dissipate a voltage level of the cell node, holding data "1", to be lower than the bitline precharge voltage VBL. Such a twin-cell memory has a longer refresh time (e.g., several seconds) than the traditional single cell memory typically about 100~200 ms. Further, a stand-by current is reduced as compared to the single cell memory. The refresh operation is similar to a normal read operation except that sense data does not turn out of the memory chip.

An instance of a SRAM-type memory, as well as DRAMs, employing the twin-cell structure has been described in the publication, entitled "2M×16 bit unitransistor random access memory", for Product No. "K1S321615M" (May 2001), so called "UtRAM". The UtRAM is constructed of the same internal structure as a traditional DRAM while using the same commands as SRAM, but conducts a refresh operation automatically by means of an internal control unit without an external refresh command. Thus, it performs a refresh operation for at least each cycle period, even during read/write commands. If the refresh operation is not performed for each cycle period, a refresh operation concurrent with read/write operations can result in loss of data stored in memory cells. As a result, the twin-cell SRAM needs to lengthen an access time or to degrade an operation speed relative to other single-cell DRAMs.

Therefore, a need exists for a system and method for a twin-cell memory device having a long refresh time and high speed of operation

SUMMARY OF THE INVENTION

It is therefore an object of the present invention to provide a twin-cell SRAM enhancing access time and speed in operation.

It is another object of the present invention to provide a method for controlling wordlines in a twin-cell SRAM with a shortened wordline activation time It is further another object of the present invention to provide a method for conducting operations of reading, writing, and refreshing in a DRAM-type SRAM, with a shortened wordline activation time.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

Preferred embodiments of the present invention will be described below in more detail, with reference to the accompanying drawings.

DESCRIPTION OF THE PREFERRED EMBODIMENTS

Figure 1:
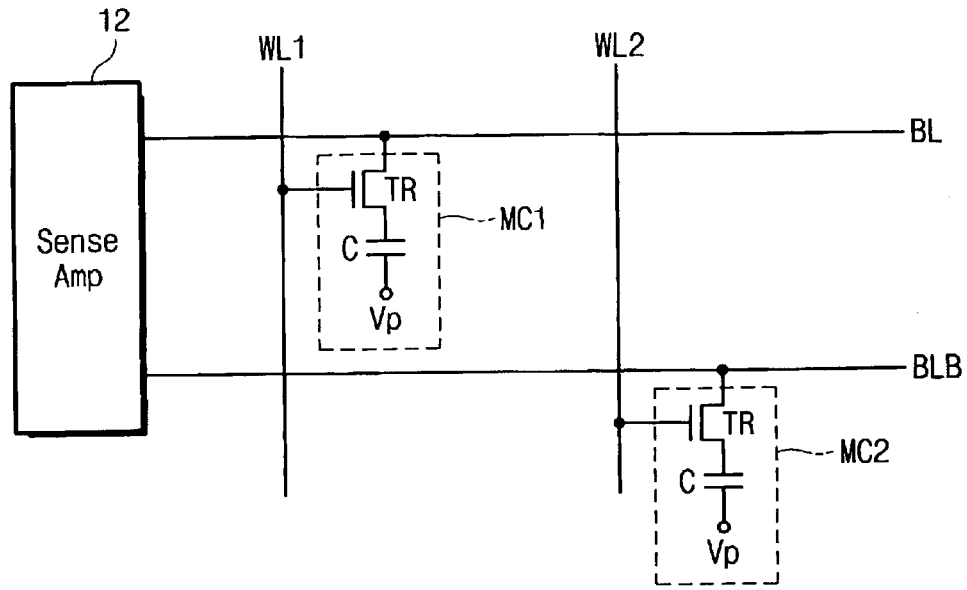
FIG. 1 illustrates a typical core structure of a memory cell array in a dynamic random access memory.
Figure 2:
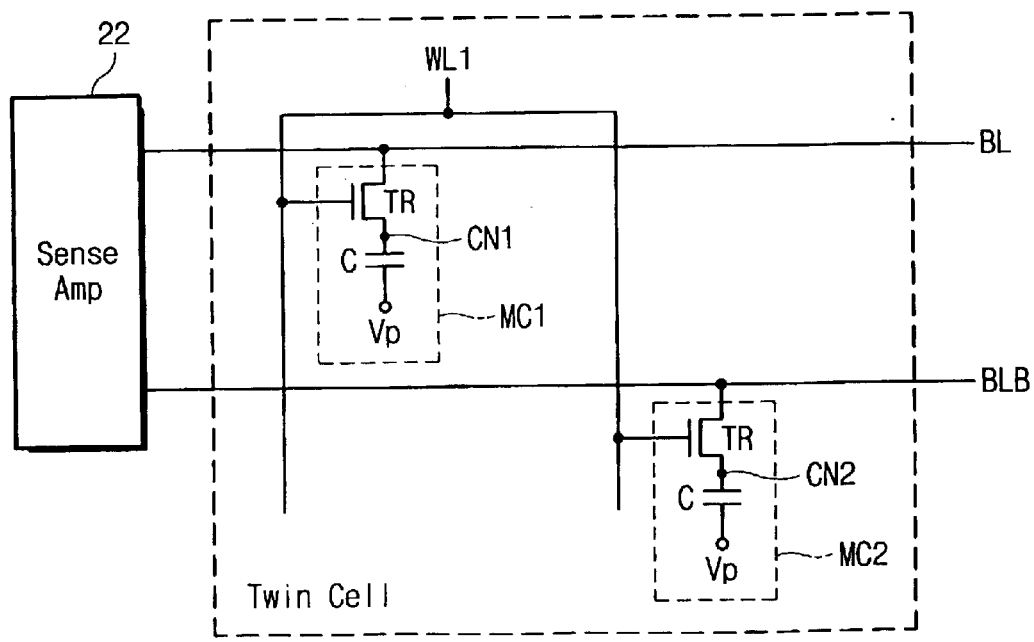
FIGS. 2 and 3 illustrate general core structures of twin-cell array RAMs.
Figure 3:
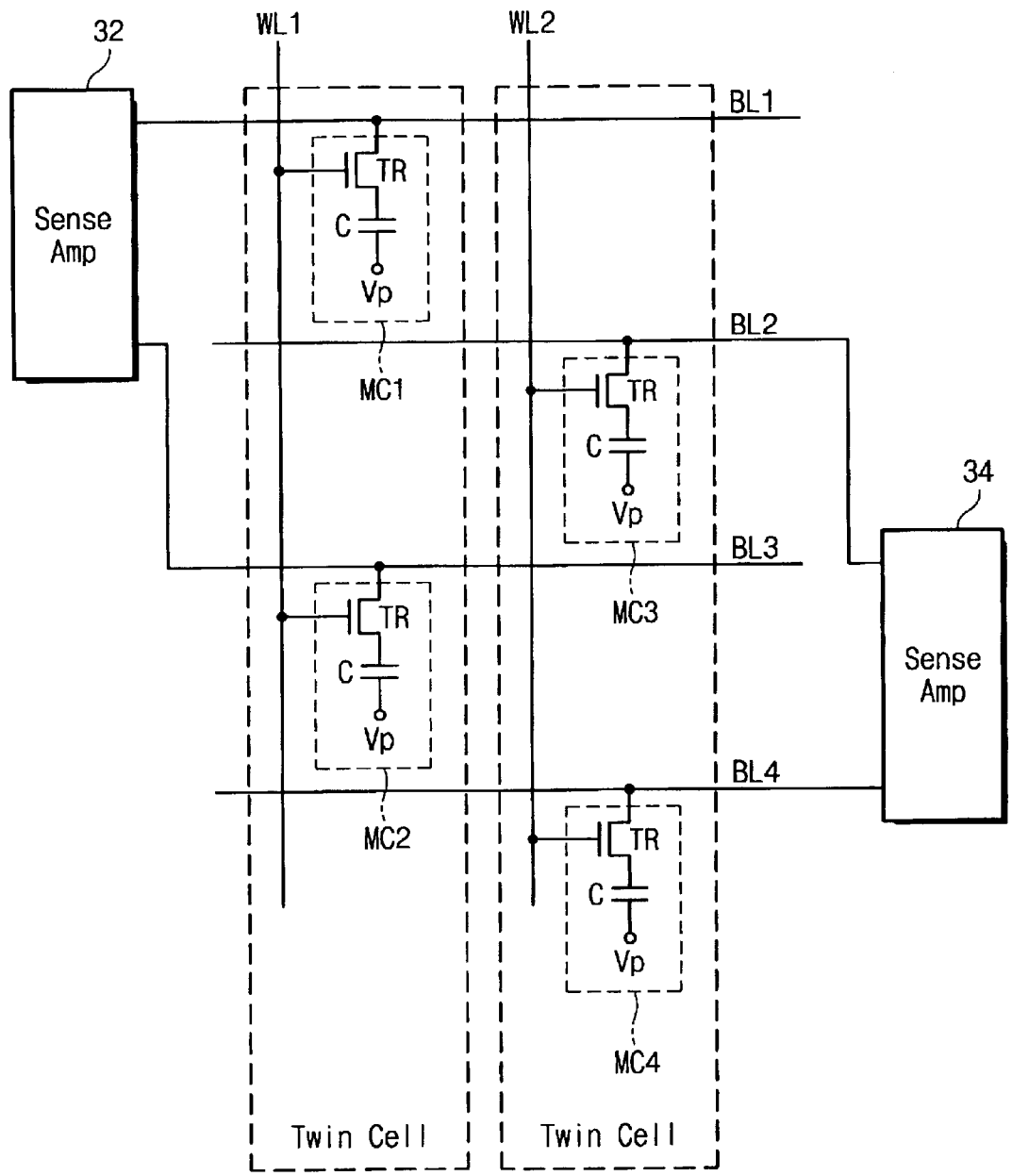
Figure 4A:
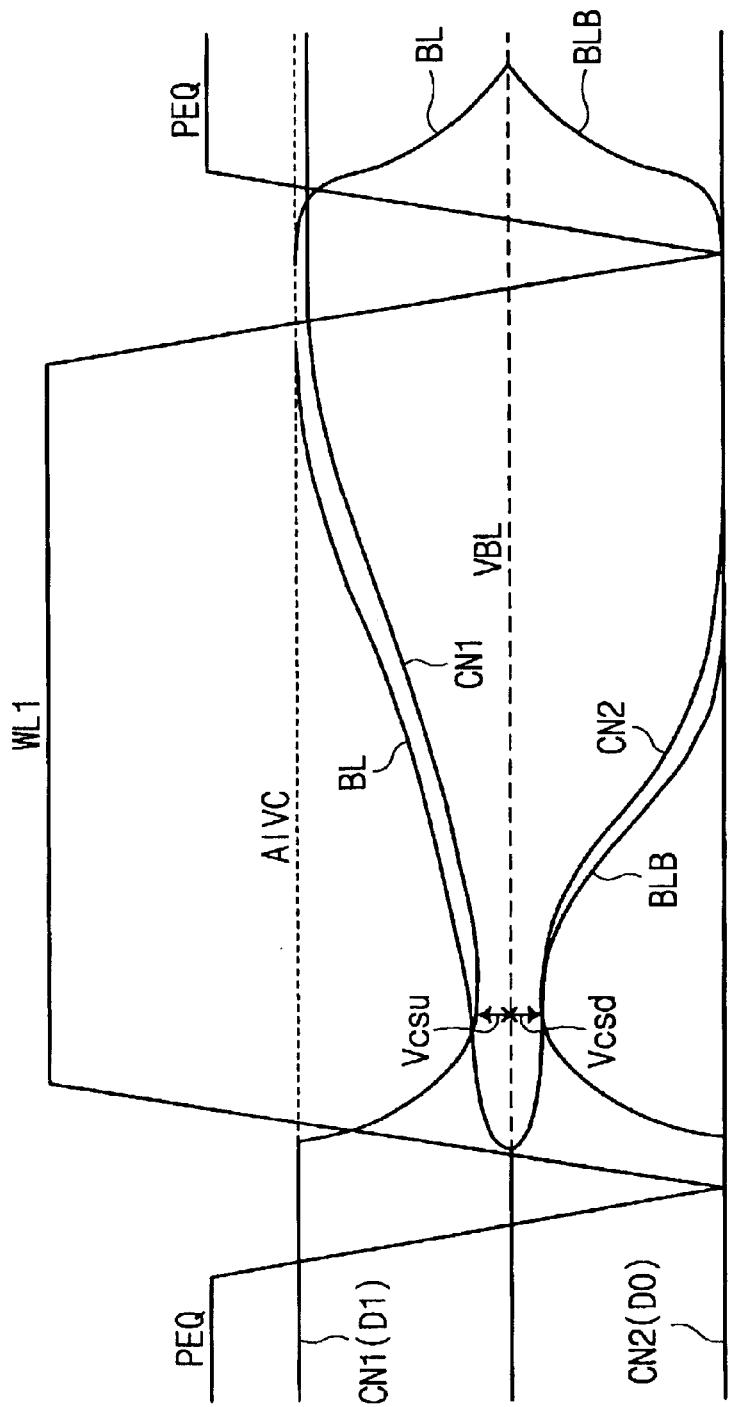
FIG. 4A is a timing diagram of a refresh operation in the twin-cell array core shown in FIG. 2 or 3.
Figure 4B:
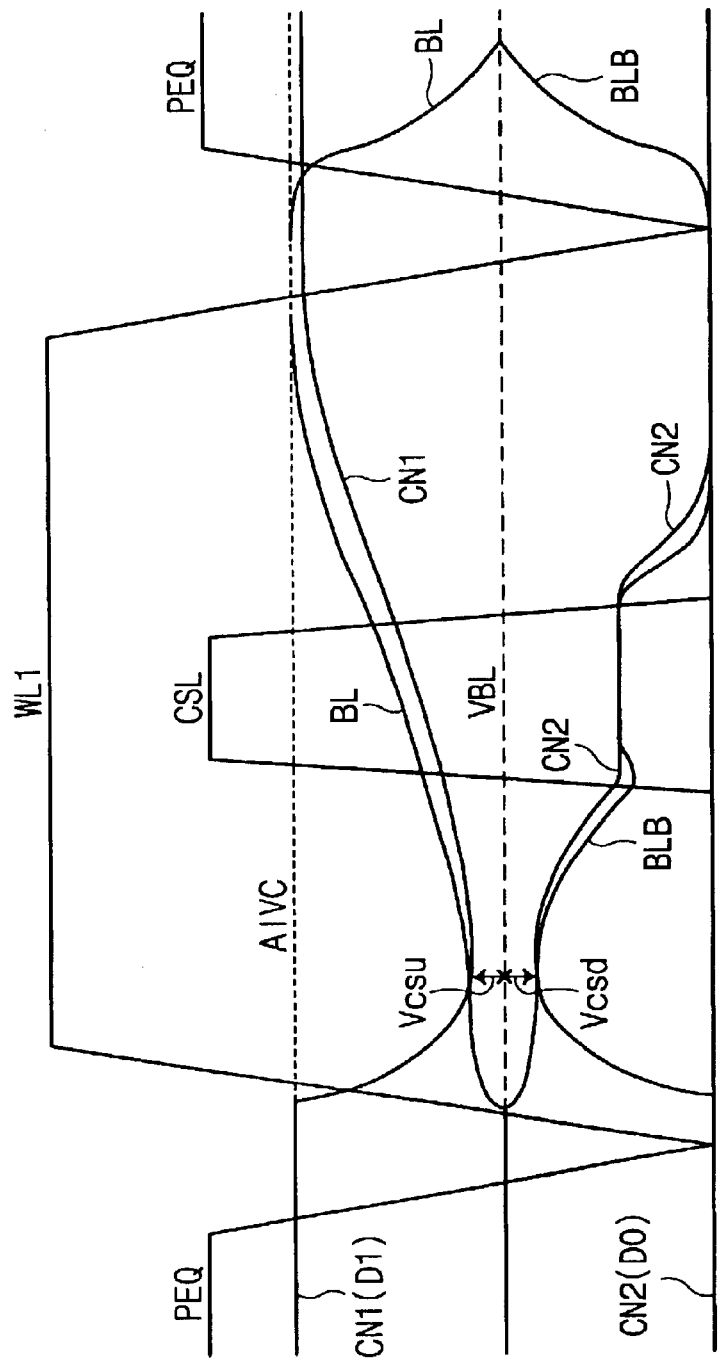
FIG. 4B is a timing diagram of a read operation in the twin-cell array core shown in FIG. 2 or 3.
Figure 5:
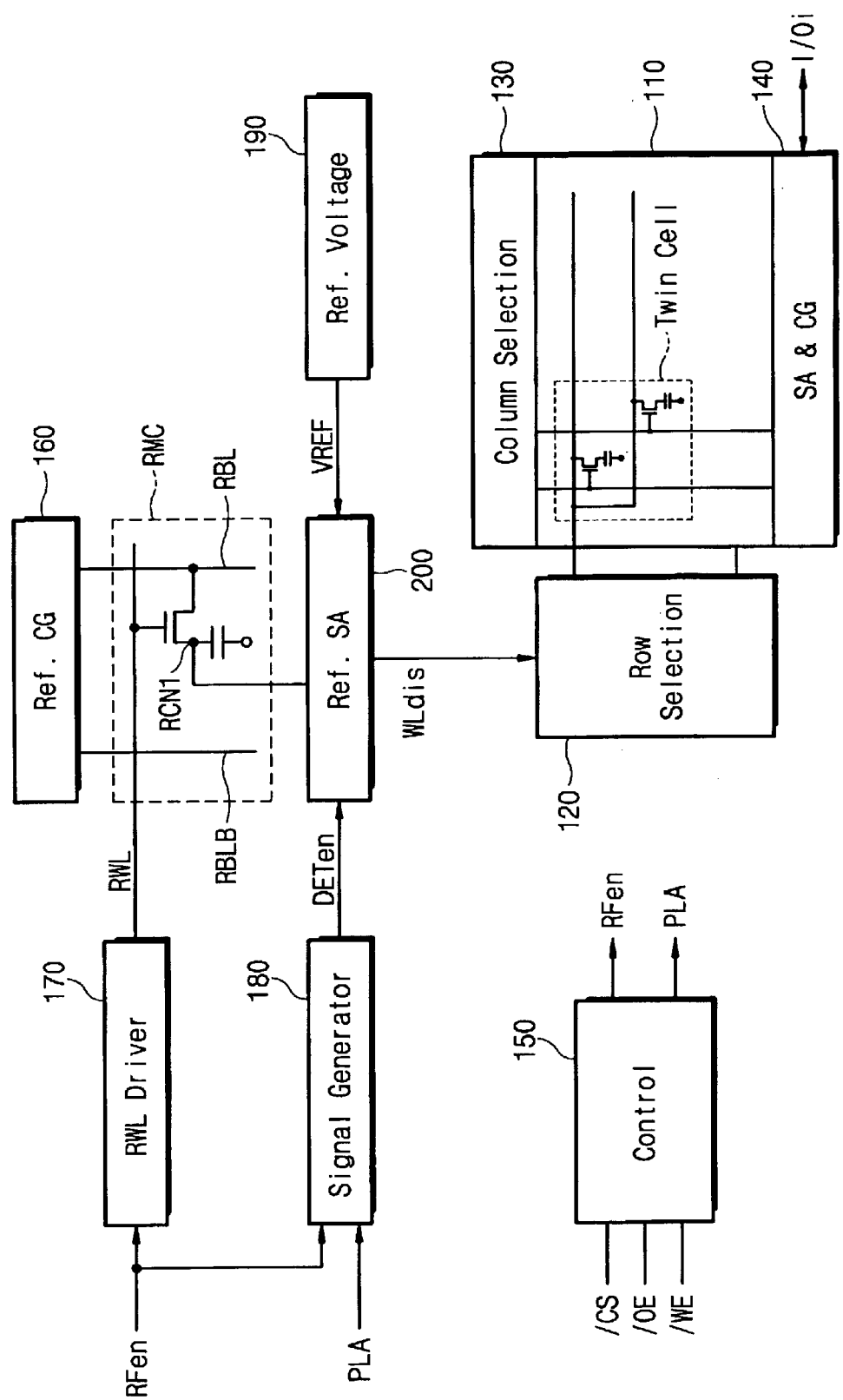
FIG. 5 is a block diagram of a static RAM according to the invention.
Figure 6:
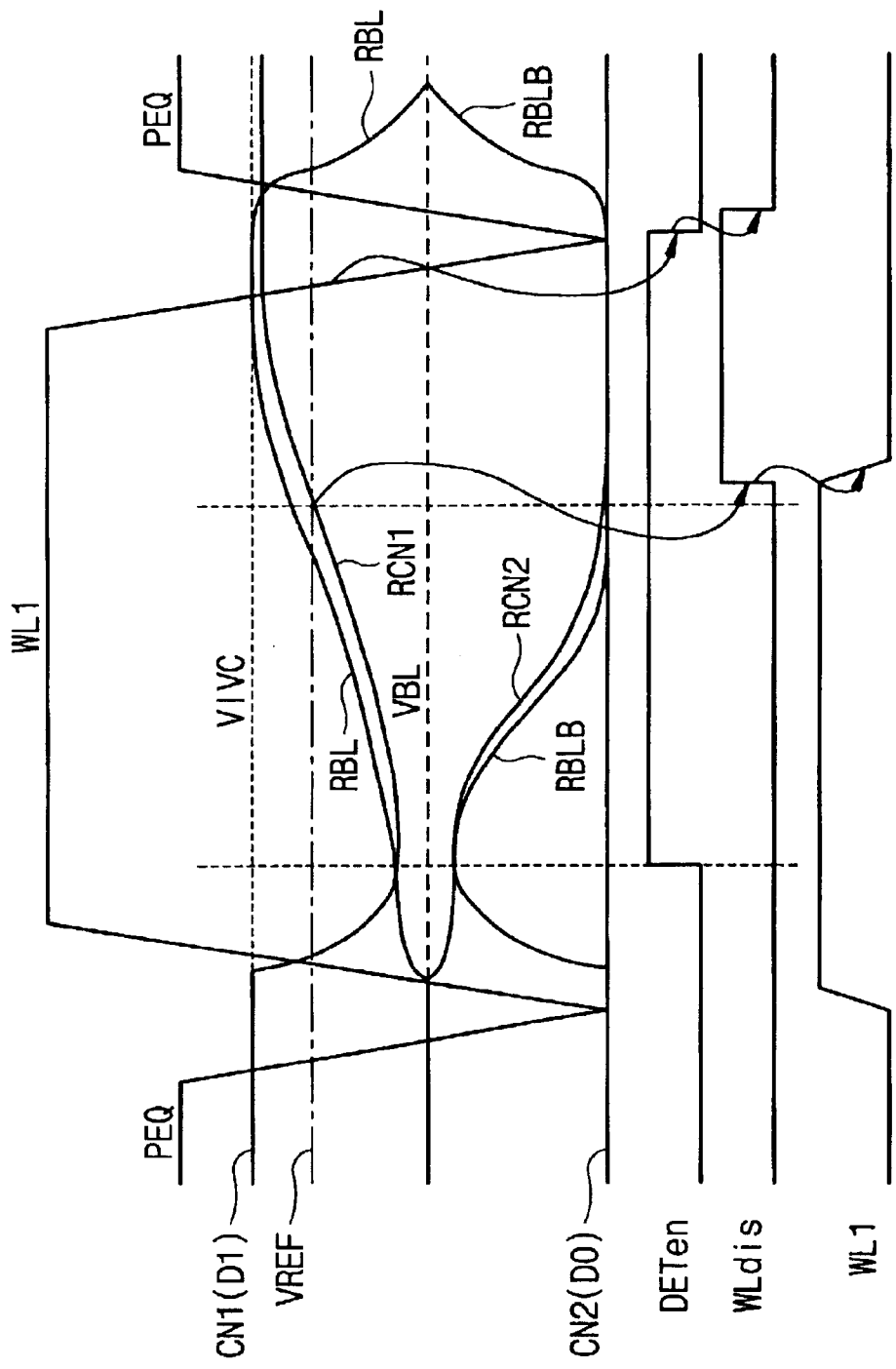
FIG. 6 shows an overall operation timing in the static RAM shown in FIG. 5.

It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details FIG. 5 illustrates a functional structure of a SRAM with twin-cells. A timing diagram related to the structure of FIG. 5 is shown in FIG. 6. A Twin-cell structure employed in a memory cell array 110 may be any one of those kinds shown in FIGS. 2 and 3, or others. According to an embodiment of the present invention, the memory cell array 110 adopts the twin-cell illustrated by FIG. 2. The SRAM includes, in addition to the memory cell array 110, a row selection circuit 120, a sense-amp/column-gate (SA&CG) block 140, a column selection circuit 130, a control block 150, a reference column gate 160, a reference wordline driver 170, a signal generator 180, a reference voltage generator 190, a reference sense amplifier 200, and a reference cell array RMC.

The row selection circuit 120 activates a wordline (or row) arranged in the memory cell array 110. The SA&CG block 140 detects and amplifies data stored in the twin-cell MC coupled to an activated wordline, in response to a sensing enable signal PLA provided from the control block 150 and turns the data into input/output lines I/Oi. The control block 150 generates the sensing enable signal PLA and a refresh enable signal RFen from control signals /CS, /OE, and /WE provided externally.

The reference cell RMC comprises a transistor and a capacitor. The transistor comprises a gate coupled to a reference wordline RWL, and a current channel connected between a reference bitline RBL and a reference cell node RCN1, wherein the RCN1 is disposed between the reference cell transistor and capacitor. The reference cell RMC is designed to store data "1". A pair of reference bitlines RBL and RBLB are connected to the reference column gate 160 that supplies the reference data "1" into the reference cell RMC. The complementary reference bitline RBLB is also coupled to another reference cell (not shown). The reference cell RMC can be implemented as a twin-cell structure or a single-cell structure.

The reference wordline RWL is coupled to the driver 170 that activates the reference wordline RWL in response to the refresh enable signal RFen provided from the control block 150. At the time of the RWL activation, as shown in FIG. 6, a wordline in the memory cell array 110 becomes active by the row selection circuit 120. The RWL activation varies voltage levels of the reference bitlines RBL and RBLB, such that the RBL voltage rises while the RBLB voltage drops.

The signal generator 180 activates the detection enable signal DETen in response to the refresh enable signal RFen and the sensing enable signal PLA. During an activation of the sensing enable signal PLA after the reference wordline RWL has turned on, the detection enable signal DETen goes up to a high level from a low level. FIG. 6 shows the detection enable signal DETen becomes active upon a sensing operation for the selected wordline in the memory cell array 110.

The detection circuit 200, coupled to the reference cell node RCN1, determines whether a current voltage level at the node RCN1 is identical to the reference voltage VREF generated from the reference voltage generator 190. The reference voltage VREF may be established on a low voltage of about 0.3 V through 0.4V, and can vary depending on manufacturing factors and loading capacity. If a voltage of the reference cell node RCN1 is lower than the reference voltage VREF, the detection circuit 200 outputs a wordline disable signal WLdis of a low level, maintaining a current activation state of the wordline. Otherwise, if the RCN1 voltage reaches the reference voltage VREF, the wordline disable signal WLdis is generated with a high level from the detection circuit 200, making the wordline shut down.

After the wordline deactivation by the signal WLdis, the reference cell node RCN1, which has stored data "1", is recharged up to a power supply voltage of the memory cell array, and then the reference wordline RWL becomes nonconductive. Subsequent to the deactivation of the reference wordline RWL, the detection enable signal DETen and the wordline disable signal WLdis are deactivated in series, terminating the refresh operation.

Figure 7:
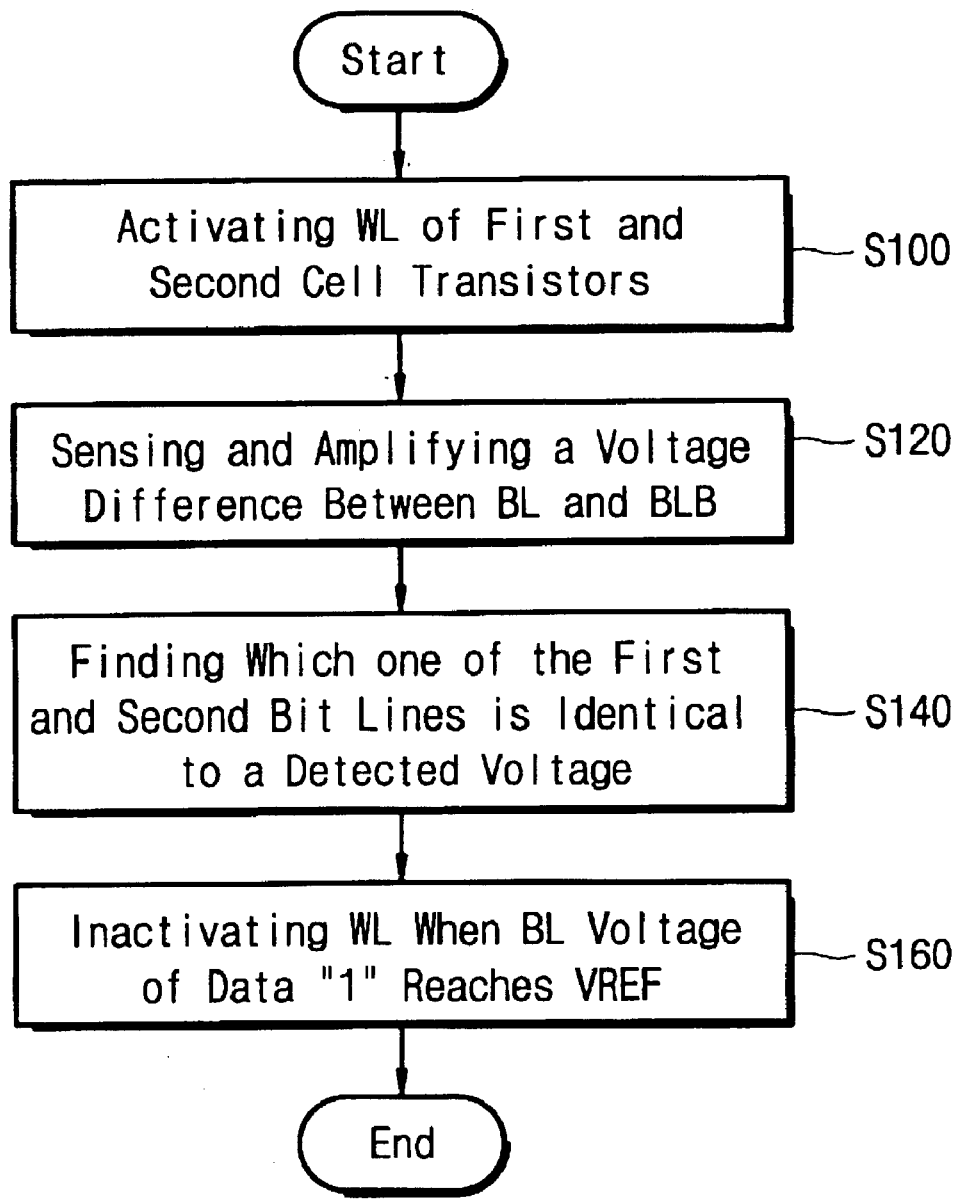
FIG. 7 is a flow chart of a refresh operation in the static RAM.
Figure 8:
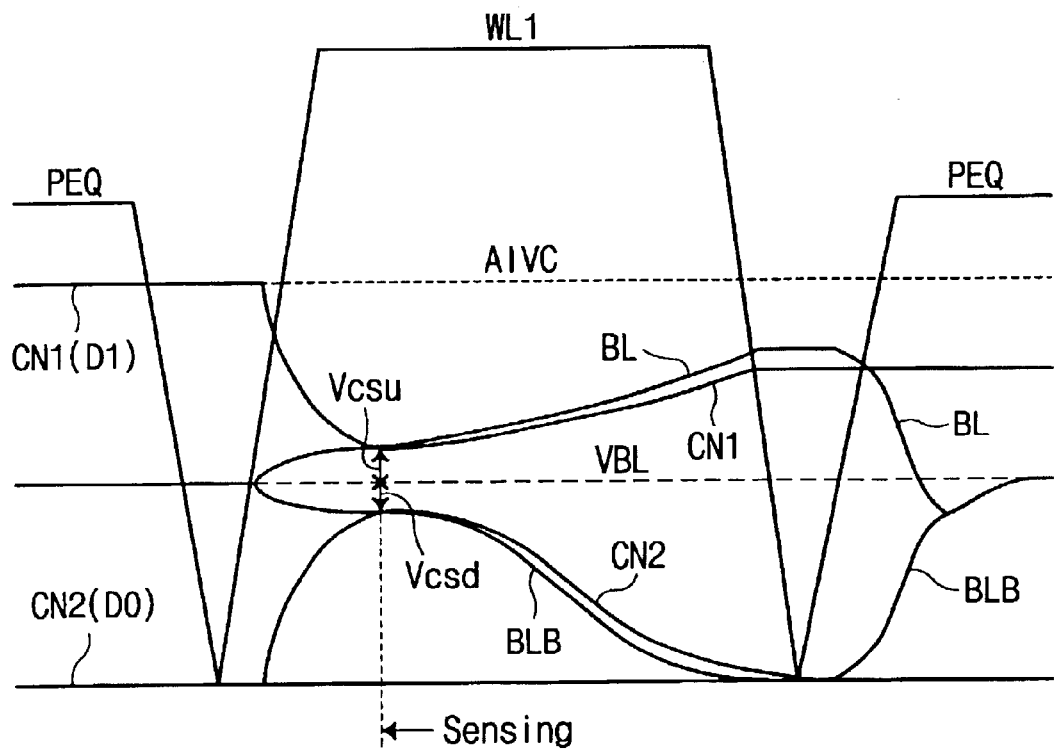
FIG. 8 is a timing diagram of the refresh operation.
Figure 9:
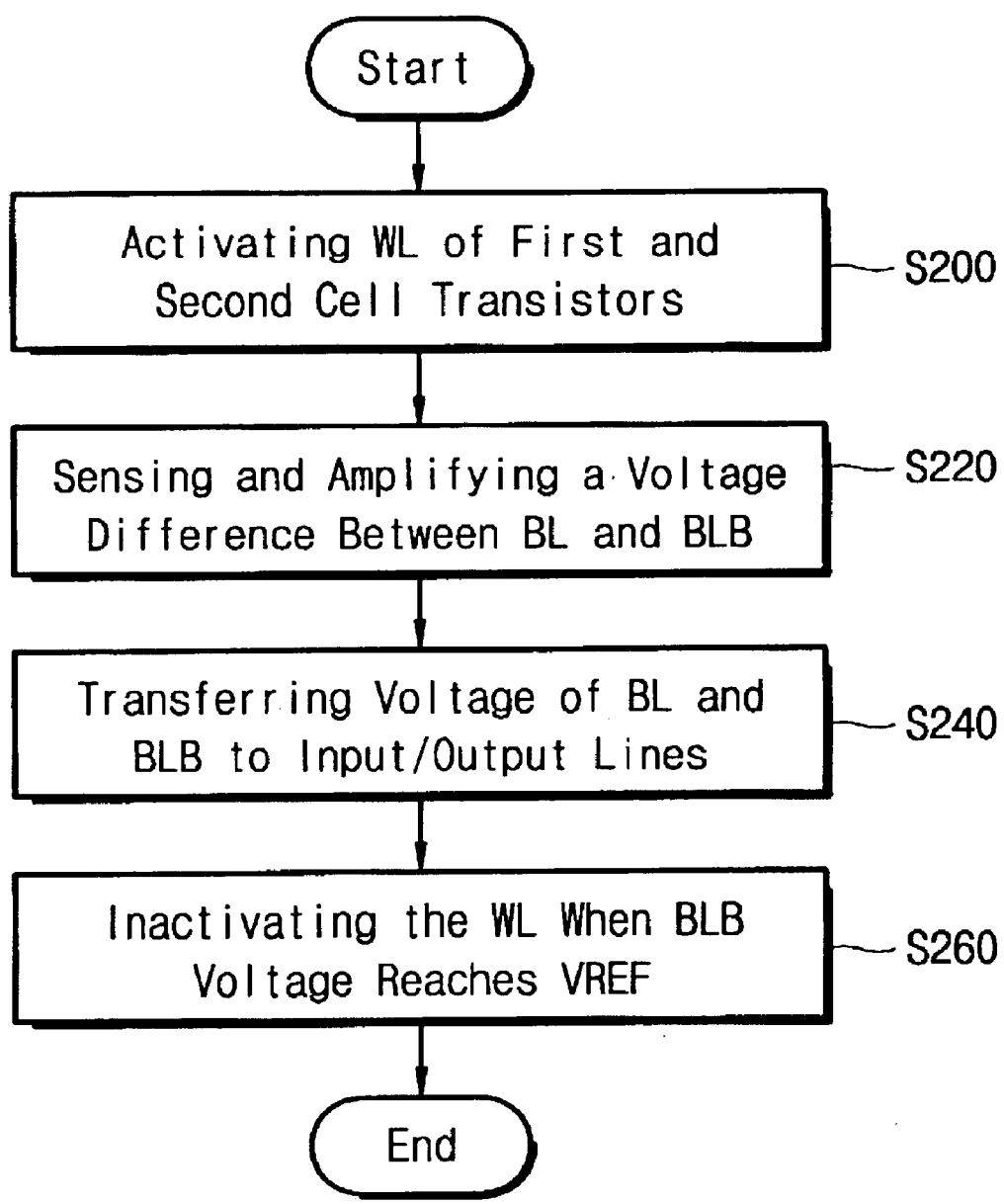
FIG. 9 is a flow chart of a read operation in the static RAM.
Figure 10:
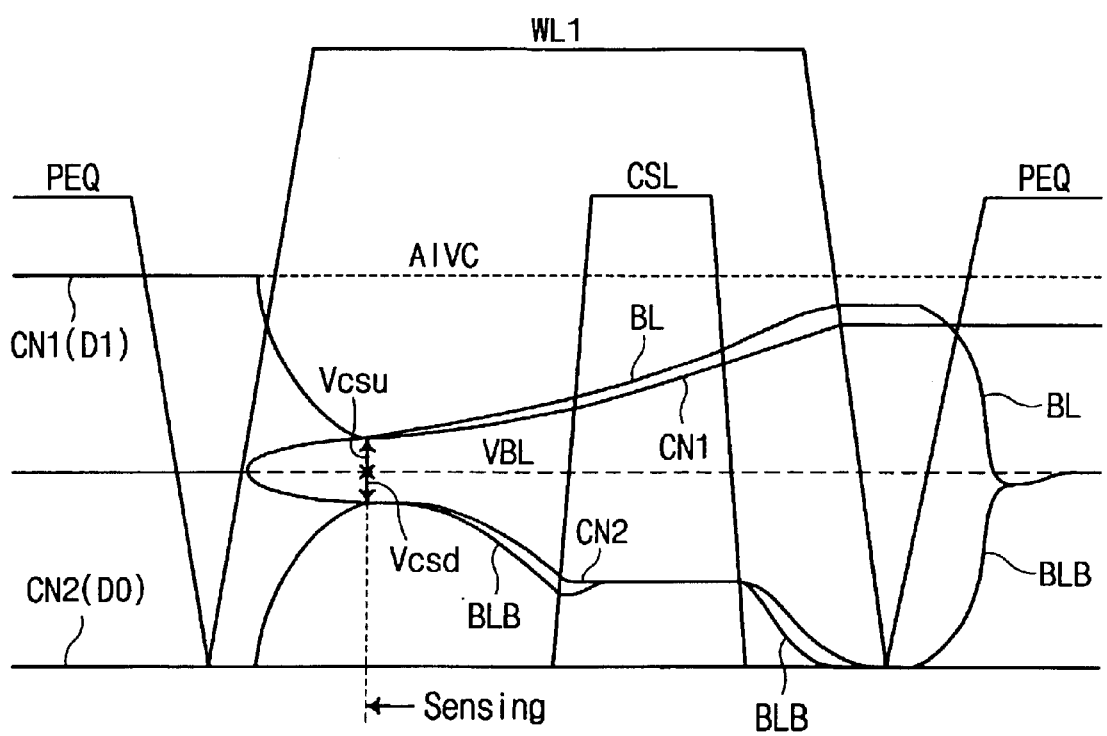
FIG. 10 is a timing diagram of the read operation in the static RAM.

Refresh and read operations in a twin-cell SRAM are described with reference to FIGS. 7 through 10. FIGS. 7 and 8 show a refresh operation, while FIGS. 9 and 10 show a read operation. It would be understood that the timing features shown in FIG. 6 are also applicable to the following description, as an overall operation. For an appropriate explanation, it assumed the memory cell array 110 includes memory cells like MC1 and MC2, for example, are constructed in the form of the twin-cell structure shown in FIG. 2, and the memory cell MC1 stores data "1" while the memory cell MC2 holds data "0". Therefore, the cell node CN1 of the memory cell MC1 is at the power supply voltage level for use of the memory cell array while the cell node CN2 of the memory cell MC2 is at the ground voltage level GND.

As well known, an internal refresh operation in the twin-cell SRAM without an external command is similar to a read operation but it does not send detected data out of the chip. Referring to FIGS. 7 and 8, before a refresh operation, the bitlines BL and BLB are at the precharge voltage VBL (0.5 AVIC) during a precharge cycle. Beginning the refresh operation, a selected wordline WL1 coupled to the memory cells MC1 and MC2 becomes conductive S100. As the cell capacitors C are electrically connected to the bitlines BL and BLB through the conductive memory cells MC1 and MC2, a charge sharing operation automatically starts to make the bitlines BL and BLB respond to the charges of the capacitors respectively. Thus, the voltage of the bitline BL rises by Vcsu while the voltage of the bitline BLB drops by Vcsd. With a voltage difference between the bitlines enough to trigger a sense amplifier (e.g., 22 of FIG. 2) in the SA&CG block 140, the sense amplifier develops (senses and amplifies) the voltage difference of the bitlines BL and BLB S120. Thus, the BL voltage BL goes up to the array power supply voltage AIVC while the BLB voltage down to the ground voltage GND. The voltage of the bitlines BL and BLB charges (e.g., refreshes) the corresponding cell nodes CN1 and CN2.

It is determined whether the bitline voltage corresponding to high-level data "1" is equal to the reference voltage VREF S140. If the BL voltage is not equal to the reference voltage VREF, the wordline WL1 will remain active, maintaining the restore condition. If the BL voltage reaches the reference voltage VREF, the wordline WL1 becomes inactive (nonconductive) S160, terminating the restore operation. The reference voltage VREF is designed to level 80% of the power supply voltage AIVC, e.g., 0.3~0.4V.

In the refresh operation, it can be seen that the selected wordline turns inactive even before the cell node CN1 is recharged up to the power supply voltage AIVC. Such an early deactivation for the wordline shortens an activation time of wordline, and reduces the amount of refresh current or standby current, without adding to a requisite refresh cycle period.

Assuming, in a single-cell memory structure, a refresh failure occurs when a cell node voltage is AIVC−Vx (Vx is a certain voltage lower than AIVC), a refresh failure in a twin-cell structure can be generated at the voltage of 0.5AIVC−Vx or VBL−Vx. Thus, due to a leakage current, the twin-cell structure meets with a refresh failure when a cell node voltage is lowered by 0.5AIVC+Vx or VBL+Vx, while the single-cell structure falls when a cell node voltage is lowered by Vx from the power supply voltage AIVC. As a result, it is possible for the present twin-cell SRAM to possess an improved refresh cycle time (e.g., longer) together with reducing refresh current or standby current. Leakage current decreases exponentially with a decrease of a cell node voltage, and a refresh time increases in the twin-cell SRAM according to an embodiment of the present invention.

The sense amplifier can be constructed with PMOS transistors (not shown) to pull the BL voltage up to the power supply voltage AIVC and NMOS transistors (not shown) to pull the BLB voltage down to the ground voltage GND. Because the current drivability of a PMOS transistor is less than that of an NMOS of equal size, a pull-up operation for BL is faster than a pull-down operation for BLB. In the twin-cell structure, for the purpose of preventing a sensing failure when the cell node voltage drops by VBL+Vx, the cell node voltage corresponding to data "0" needs to return to the ground voltage GND first. During the development of the bitlines BL and BLB, as shown in FIG. 8, recharging the cell node (i.e., CN1), which is to be set to the ground voltage GND, proceeds faster than recharging the counter cell node (i.e., CN2), which is to be set to the power supply voltage AIVC.

As current leaks from a storage cell, the cell node voltage corresponding to data "1" degrades exponentially, a refresh time for recharging the cell node to the power supply voltage AIVC is similar to that for recharging it to a lower voltage than the power supply voltage (e.g., 0.3~0.4V lower). The cell node of data "1" can be recharged at the end of the restore period relative to its beginning because of a smaller source-to-drain voltage difference of the PMOS transistor and a smaller charging current, resulting in a timing gap between the recharging times with AIVC and the voltage lower than AIVC by 0.3~0.4V. However, since the cell node of data "1" is charged up to 80% of AIVC, which is enough to correspond to data "1", while the cell node of data "0" fully drops to the ground voltage, the present twin-cell SRAM may shorten a wordline activation time without degrading refresh performance.

In reading data from a memory cell in the twin-cell SRAM, referring to FIGS. 9 and 10, the method for wordline activation and a restore operation, from steps S200 to S220 of FIG. 9, are similar to the aforementioned refresh operation (See FIG. 7.). Completing the recharge operation for the cell nodes CN1 and CN2, a column selection line CSL is conductive by a column selection signal supplied from the column selection circuit 130 (See FIG. 5.) turns on switching transistors (not shown) to connect the bitlines BL and BLB to their corresponding input/output lines at a step S240. As shown in FIG. 10, voltages of the bitline BLB and the cell node CN2 are clamped on a specific voltage level while those of BL and CN1 are not influenced. After an inactivation of the column selection line CSL, the selected wordline WL1 turns nonconductive when the BLB voltage reaches the reference voltage VREF in a step S260.

The selected wordline WL1 becomes inactive when the cell node CN2 of the memory cell MC2 storing data "0" is recharged to the ground voltage GND. During the read operation, the time for recharging the cell node corresponding to data "0" is later than that for recharging the cell node corresponding to data "1" up to 80% of AIVC and earlier than that for fully charging the cell node of data "1" up to AIVC. Therefore, such wordline deactivation at the time of charging the cell node of data "0" to the ground voltage can shorten the wordline activation. Writing data in the present twin-cell SRAM is similar with the read operation, but data is applied to the bitlines from the input/output lines through the switching transistors controlled by the column selection line CSL.

Figure 11:
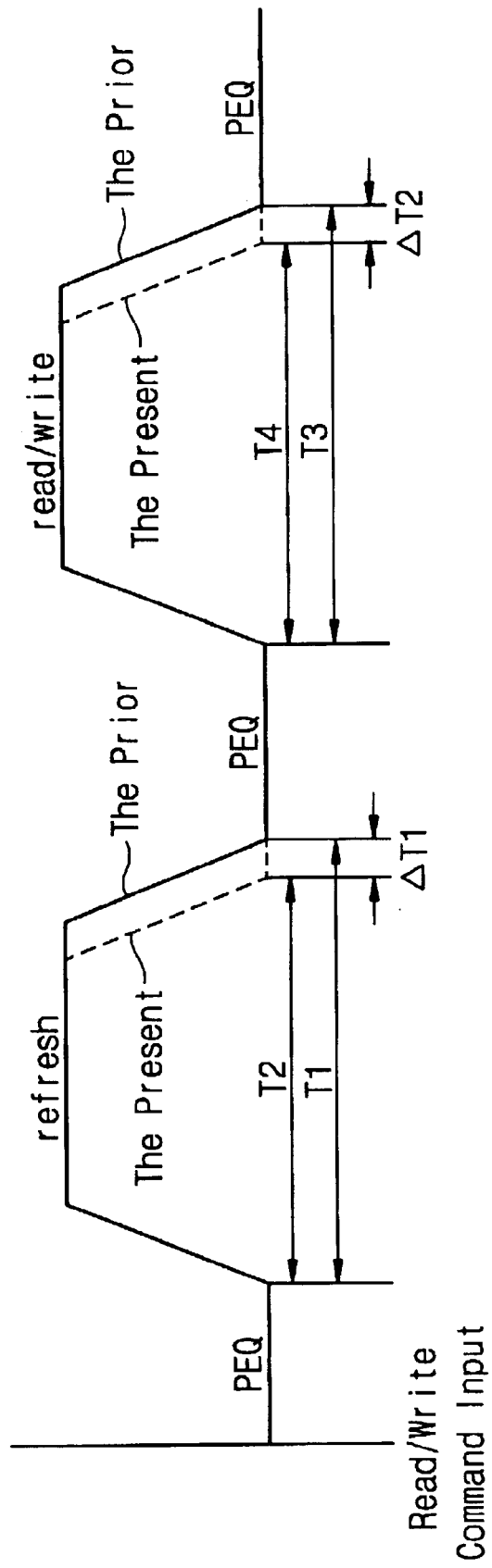
FIG. 11 is a diagram comparing the conventional with the present one with respect to an access time in static SRAMs.

FIG. 11 illustrates the present wordline activation times of the refresh and read/write operations, T2 and T4, are shorter than those of the conventional, T1 and T3, by T1 and T2, respectively. Thus, the access time in the present twin-cell SRAM is less than that of the prior art by T1+T2.

As described above, the present twin-cell SRAM shortens a wordline activation time either in a refresh operation or read/write operations, are reduces the amount of refresh current or standby current needed, because a wordline selected in operation turns inactive when a cell node voltage corresponding to data "1" reaches 80% of a array power supply voltage or when a cell node voltage corresponding to data "0" downs to a ground voltage. By means of the shortening of the wordline activation time, it is possible to reduce the whole access time including the refresh and read/write operations therein.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method of accessing data in a static random access memory, comprising the steps of:
    activating a wordline coupled to a first cell transistor and second cell transistor;
    sensing and amplifying a voltage difference between a first bitline, coupled to the a first cell capacitor through the first cell transistor, and a second bitline coupled to a second cell capacitor through the second cell transistor; and
    deactivating the wordline when a voltage of the first bitline or a voltage of the second bitline reaches a predetermined voltage.

2. The method of claim 1, wherein the first cell transistor and the first cell capacitor form a first memory cell and the second cell transistor and the second cell capacitor form a second memory cell, the first memory cell and the second memory cell forming a twin-cell.

3. The method of claim 2, wherein the first memory cell and the second memory cell store complementary data.

4. The method of claim 1, wherein the predetermined voltage is set at 0V during read/write operations.

5. The method of claim 1, wherein the predetermined voltage is set at a voltage lower than an array power supply voltage by about 0.3~0.4V.

6. A method of refreshing data in a static random access memory, comprising the steps of:
    activating a wordline coupled to a first cell transistor and a second cell transistor;
    sensing and amplifying a voltage difference between a first bitline, coupled to the a first cell capacitor through the first cell transistor, and a second bitline coupled to a second cell capacitor through the second cell transistor;
    determining whether a voltage of one of the first bitline and the second bitline, corresponding to a high-level data, reaches a predetermined voltage; and
    deactivating the wordline when the voltage of one of the first bitline and the second bitline, corresponding to the high-level data, reaches the predetermined voltage.

7. The method of claim 6, wherein the first cell transistor and the first cell capacitor form a first memory cell and the second cell transistor and the second cell capacitor form a second memory cell, the first memory cell and the second memory cell forming a twin-cell.

8. The method of claim 7, wherein the first memory cell and the second memory cell store complementary data.

9. The method of claim 6, wherein the predetermined voltage is set at a voltage lower than an array power supply voltage by about 0.3~0.4V.

10. A method of reading data in a static random access memory, comprising the steps of:
    activating a wordline coupled to a first cell transistor and a second cell transistor;
    sensing and amplifying a voltage difference between a first bitline, coupled to the a first cell capacitor through the first cell transistor, and a second bitline coupled to a second cell capacitor through the second cell transistor;
    electrically connecting the bitlines to corresponding a plurality of input/output lines; and
    deactivating the wordline when a voltage of one of the first bitline and the second bitline, corresponding to a low-level data, reaches a predetermined voltage.

11. The method of claim 10, wherein the first cell transistor and the first cell capacitor form a first memory cell and the second cell transistor and second cell capacitor form a second memory cell, the first memory cell and the second memory cell forming a twin-cell.

12. The method of claim 11, wherein the first memory cell and the second memory cell store complementary data.

13. The method of claim 10, wherein the predetermined voltage is set at 0V.

14. The method of claim 10, wherein the predetermined voltage is set at 0V.

15. A method of writing data in a static random access memory, comprising the steps of:
    activating a wordline coupled to a first cell transistor and a second cell transistor;
    electrically connecting first and second input/output lines to first and second bitlines respectively;
    sensing and amplifying a voltage difference between the first bitline, coupled to the a first cell capacitor through the first cell transistor, and the second bitline coupled to a second cell capacitor through the second cell transistor; and
    deactivating the wordline when a voltage of one of the first bitline and the second bitline, corresponding to a low-level data, reaches a predetermined voltage.

16. The method of claim 15, wherein the first cell transistor and the first cell capacitor form a first memory cell and the second cell transistor and the second cell capacitor form a second memory cell, the first memory cell and the second memory cell forming a twin-cell.

17. The method of claim 16, wherein the first memory cell and second memory cell store complementary data.

18. A static random access memory comprising:
    a memory cell array comprising a plurality of twin-cells arranged in a matrix of rows and columns, each twin-cell comprising a first memory cell and a second memory cell, the first memory cell formed of a first cell transistor and a first cell capacitor, the second memory cell formed of a second cell transistor and a second cell capacitor, the first memory cell and the second memory cell coupled to a row in common and coupled to a first bitline and a second bitline respectively, the first bitline and the second bitline corresponding to a column;

a row selection circuit for activating the row in common in response to a row address;

a sense amplifier for developing a voltage difference between the first bitline and the second bitline in response to a sensing enable signal; and detection means for deactivating the row in common when a voltage of the first bitline or a voltage of the second bitline reaches a predetermined voltage.

19. The static random access memory of claim 18, wherein the detection means comprises:

a reference voltage generator;

a reference memory cell connected to a reference row, storing a high-leveled data, the reference memory cell formed of a reference transistor and a reference capacitor;

a driver for activating the reference row in response to a refresh enable signal; and a detection circuit for determining whether a voltage of a cell node, which is disposed between the reference transistor and the reference capacitor, reaches a predetermined voltage;

whereby the activated row becomes inactive when the cell node voltage reaches the predetermined voltage.

20. The static random access memory of claim 19, wherein the predetermined voltage is a voltage lower than an array power supply voltage by about 0.3–0.4V.

21. The static random access memory of claim 19, wherein the reference row becomes inactive after the cell node is charged up to an array power supply voltage.

22. A static random access memory comprising:

a memory cell array comprising a plurality of twin-cells arranged in a matrix of rows and columns, each twin-cell comprising a first memory cell and a second memory cell, the first memory cell formed of a first cell transistor and a first cell capacitor, the second memory cell formed of a second cell transistor and a second cell capacitor, the first memory cell and the second memory cell coupled to a row in common and coupled to a first bitline and a second bitline respectively, the first bitline and the second bitline corresponding to a column;

a row selection circuit for activating the row in common in response to a row address;

a sense amplifier for developing a voltage difference between the first bitline and the second bitline in response to a sensing enable signal; and a column gate circuit for connecting the bitlines to corresponding input/output lines during a read operation and for connecting the input/output lines to the bitlines during a write operation;

wherein the activated row becomes inactive when a voltage of one of the first bitline and the second bitline, corresponding to a low-level data, reaches a predetermined voltage.

23. The static random access memory of claim 22, wherein the predetermined voltage is about 0V.

* * * * *